US 6,684,373 B1

(12) United States Patent
Bodine et al.

(10) Patent No.: US 6,684,373 B1
(45) Date of Patent: Jan. 27, 2004

(54) OPTIMIZE GLOBAL NET TIMING WITH REPEATER BUFFERS

(75) Inventors: Franklin Bodine, Chippewa Falls, WI (US); Eric Fischer, Eau Claire, WI (US); Tom Arneberg, Chippewa Falls, WI (US); David Poli, Eau Claire, WI (US)

(73) Assignee: Silicon Graphics, Inc., Mountain View, CA (US)

( * ) Notice: Subject to any disclaimer, the term of this patent is extended or adjusted under 35 U.S.C. 154(b) by 228 days.

(21) Appl. No.: 09/620,504

(22) Filed: Jul. 20, 2000

(51) Int. Cl.[7] .............................................. G06F 17/50
(52) U.S. Cl. .............................................. 716/6; 716/5
(58) Field of Search ........................ 716/6, 4, 5, 7–14, 716/2, 3, 18

(56) References Cited

U.S. PATENT DOCUMENTS

| 4,896,272 | A | | 1/1990 | Kurosawa ................... 364/491 |
|---|---|---|---|---|
| 5,521,836 | A | | 5/1996 | Hartong et al. ............. 364/491 |
| 5,535,223 | A | | 7/1996 | Horstmann et al. ........... 371/27 |
| 5,555,188 | A | | 9/1996 | Chakradhar ................. 364/490 |
| 5,557,779 | A | * | 9/1996 | Minami ...................... 395/500 |
| 5,638,291 | A | * | 6/1997 | Li et al. ..................... 364/490 |
| 5,757,658 | A | | 5/1998 | Rodman et al. ............. 364/491 |
| 5,787,268 | A | | 7/1998 | Sugiyama et al. .......... 395/500 |
| 5,838,581 | A | * | 11/1998 | Kuroda ....................... 364/491 |
| 5,910,898 | A | | 6/1999 | Johannsen .................. 364/489 |
| 5,974,245 | A | * | 10/1999 | Li et al. ................. 395/500.11 |
| 6,044,209 | A | * | 3/2000 | Alpert et al. .......... 395/500.07 |
| 6,099,580 | A | * | 8/2000 | Boyle et al. .................... 716/7 |
| 6,205,572 | B1 | * | 3/2001 | Dupenloup .................... 716/5 |

* cited by examiner

Primary Examiner—Vuthe Siek
(74) Attorney, Agent, or Firm—Schwegman, Lundberg, Woessner & Kluth, P.A.

(57) ABSTRACT

A method, system, and program product for designing an electronic circuit. The electronic circuit has a source component, a sink component and a wire connecting the source and sink components. In one aspect, the wire is divided into wire segments and repeater buffers are added to connect the wire segments. The number of repeater buffers is based on the calculated delay of the global net. In another aspect, the metal routes of the wire are widened to reduce delays on a global net. In these ways, the timing goal of the electronic circuit is met, such that an operation in the electronic circuit will complete within one clock cycle.

21 Claims, 11 Drawing Sheets

OPTIMIZE GLOBAL NET TIMING WITH REPEATER BUFFERS

CROSS REFERENCE TO RELATED APPLICATIONS

This application is related to "Synthesis with Automated Placement Information Feedback," application Ser. No. 09/620,338, filed Jul. 20, 2000, and incorporated herein by reference.

FIELD OF THE INVENTION

The present invention relates to the field of computer aided design tools used for designing integrated circuits.

COPYRIGHT NOTICE/PERMISSION

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever. The following notice applies to the software and data as described below and in the drawings hereto: Copyright© Silicon Graphics Incorporated, 2000. All Rights Reserved.

BACKGROUND OF THE INVENTION

Electrical engineers use computer aided design (CAD) tools to design integrated circuits. The integrated circuit design process includes constructing the integrated circuit design out of simple circuits (e.g., "standard cells") that are electrically connected together using wire interconnects. The CAD tool stores the standard cells and connections between them in well-known databases called "netlists." A chip manufacturing foundry uses the netlist as input to build the physical integrated circuit.

As part of the design process, the CAD tool "places" and "routes" design information within a netlist using placing and routing processes (also called placers and routers) that are typically software programs executed by the CAD tool. The placer determines the optimum location of each standard cell within the integrated circuit layout on the semiconductor surface. The placer optimizes the placement location to reduce the distance between standard cells that are electrically connected to each other by wire interconnects (e.g., input/output lines). This is done to both (1) minimize the semiconductor area consumed by the integrated circuit; and (2) minimize the lengths of wire interconnects to reduce net capacitance within the design. The router optimizes the routing of input/output lines between connected standard cells, so that areas of the integrated circuit layout do not become overly congested by input/output lines and so that the timing of signals on the wire interconnects is minimized.

It is critical that the timing of signals on the wire interconnects meet the timing goal of the design, which is that operations will fit within one clock cycle. If operations do not fit within a clock cycle, the engineer must redesign the logic, which is expensive and time consuming. Thus, there is a need for a system that will automatically design the wire interconnects so that the timing goal is met.

SUMMARY OF THE INVENTION

The present invention provides solutions to the above-described shortcomings in conventional approaches, as well as other advantages apparent from the description below.

The present invention provides a method, system, and program product for designing an electronic circuit. The electronic circuit has a source component, a sink component and a wire connecting the source and sink components. In one aspect, the wire is divided into wire segments and repeater buffers are added to connect the wire segments. The number of repeater buffers is based on the calculated delay of the global net. In another aspect, the metal routes of the wire are widened to reduce delays on a global net. Thus, the invention automatically designs wire interconnects in an electronic circuit, so that the timing goal of the circuit is met, and operations in the electronic circuit will complete within one clock cycle.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention, but other embodiments may be utilized, and logical, mechanical, electrical, and other changes may be made to the embodiments without departing from the scope of the present invention. The following detailed description is, therefore, not to be taken in a limiting sense, and the scope of the present invention is defined only by the appended claims.

Figure 1:
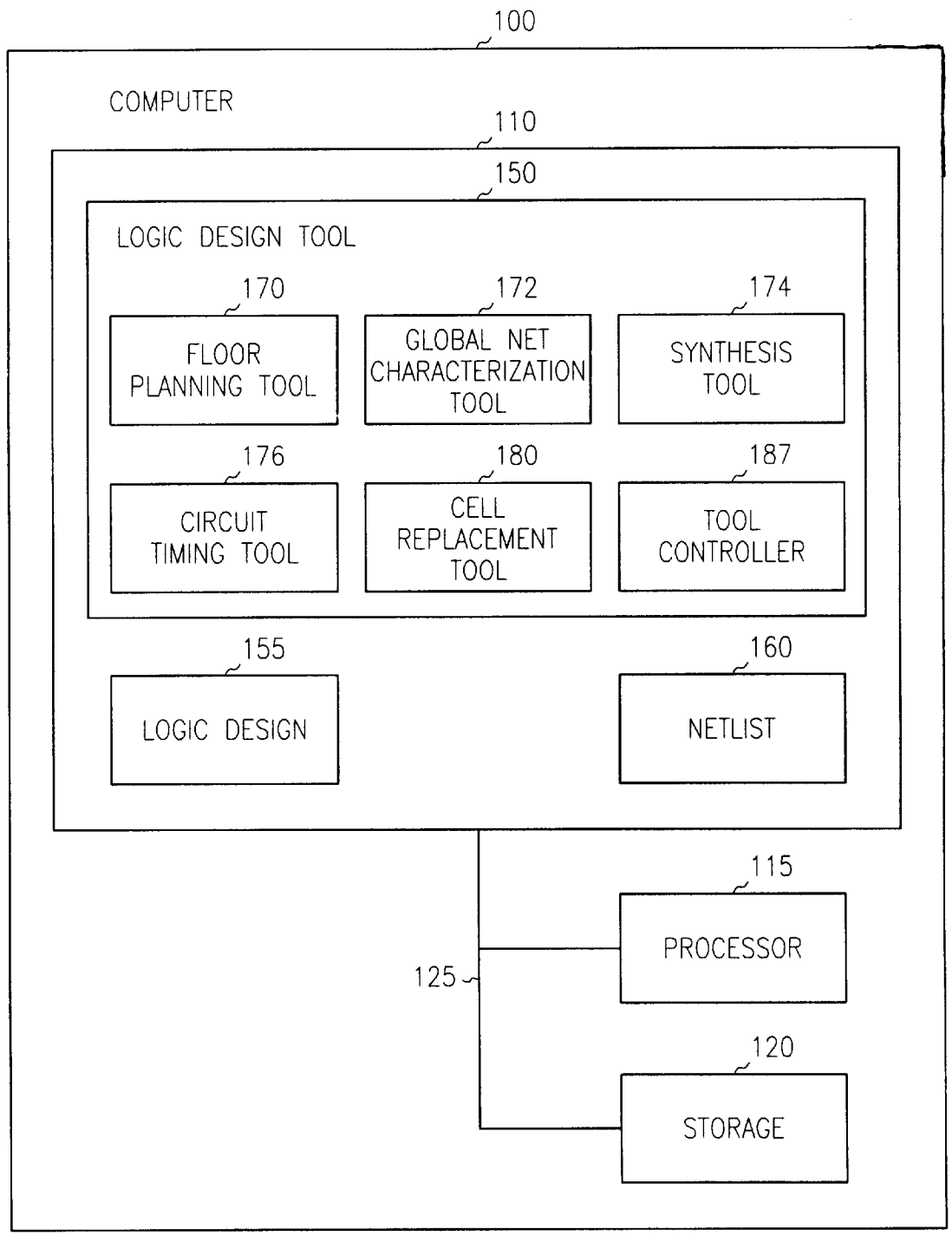
FIG. 1 depicts a block diagram of an example computer system that can be used to implement an embodiment of the invention.

FIG. 1 depicts a block diagram of an example computer system that can be used to implement an embodiment of the invention. Computer 100 contains memory 110, processor 115, and storage 120 connected via bus 125.

Memory 110 comprises a number of individual, volatile-memory modules that store segments of operating system and application software while power is supplied to computer 100. The software segments are partitioned into one or more virtual memory pages that each contain a uniform number of virtual memory addresses. When the execution of software requires more pages of virtual memory than can be stored within memory 110, pages that are not currently needed are swapped with the required pages, which are stored within non-volatile storage device 120. Memory 110 is a type of memory designed such that the location of data stored in it is independent of the content. Also, any location in memory 110 can be accessed directly without needing to start from the beginning. Memory 110 contains Logic Design Tool 150, logic design 155, and netlist 160. Tool 150 contains instructions capable of being executed by processor 115. In the alternative, tool 150 could be implemented by control circuitry through the use of logic gates, programmable logic devices, or other hardware components in lieu of a processor-based system.

Tool 150 contains floor planning tool 170, global net characterization tool 172, synthesis tool 174, circuit timing tool 176, cell placement tool 180, and tool controller 187. The operation of floor planning tool 170, synthesis tool 174, cell placement tool 180, and tool controller 187 are further FIG. 5. The operation of global net characterization tool 172 is further described below under the descriptions for FIGS. 2–9. Synthesis tool 174 could be implemented using the Physical Compiler tool available from Synopsys. But, any suitable synthesis tool could be used, such as the PKS tool available from Cadence. In one embodiment, the HDP (Hierarchical Design Planner) floor planning tool available from IBM is used for floor planning tool 170, although any suitable floor planning tool could be used. In one embodiment, the ChipBench tool available from IBM is used for cell placement tool 180, although any suitable cell placement tool could be used.

Processor 115 includes the portion of computer 100 that controls the operation of the entire computer system, including executing the arithmetical and logical functions contained in a particular computer program. Although not depicted in FIG. 1, processor 115 typically includes a control unit that organizes data and program storage in a computer memory and transfers the data and other information between the various parts of the computer system. Processor 115 also generally includes an arithmetic unit that executes arithmetical and logical operations, such as addition, comparison, and multiplication. Processor 115 accesses data and instructions from and stores data to volatile memory 110. Although computer 100 is shown to contain only a single processor 115 and a single bus 125, the present invention applies equally to computer systems that have multiple processors and to computer systems that have multiple buses that each perform different functions in different ways.

Non-volatile storage 120 could be any type of storage device, such as a diskette drive, a hard-disk drive, a tape drive, or a CD-ROM drive. Although storage 120 is shown as being incorporated within computer 100, it could be external to computer 100, either connected directly or on a local area network, on an external network, or attached to a remote computer system.

Computer 100 can be implemented utilizing any suitable computer such as an IBM-compatible personal computer available from a variety of vendors. But, the present invention can apply to any hardware configuration that allows circuit design, regardless of whether the computer system is a complicated, multi-user computing apparatus, a single-user work station, a hand-held device, or a network appliance that does not have non-volatile storage of its own.

As will be described in detail below, aspects of an embodiment of the invention pertain to specific method steps implementable on a computer system. In another embodiment, the invention may be implemented as a computer program product for use with a computer system. The programs defining the functions of the embodiment can be delivered to a computer via a variety of signal-bearing media, which include, but are not limited to, (1) information permanently stored on non-writeable storage media (e.g., read-only memory devices such as CD-ROM disks); (2) alterable information stored on writeable storage media (e.g., floppy disks within a diskette drive, tape drive, or a hard-disk drive, shown as storage 120 in FIG. 1); or (3) information conveyed to a computer by a communications media, such as through a computer or telephone network, including wireless communications. Such signal-bearing media when carrying computer-readable instructions that direct the functions of the present invention represent embodiments of the present invention.

Figure 2:
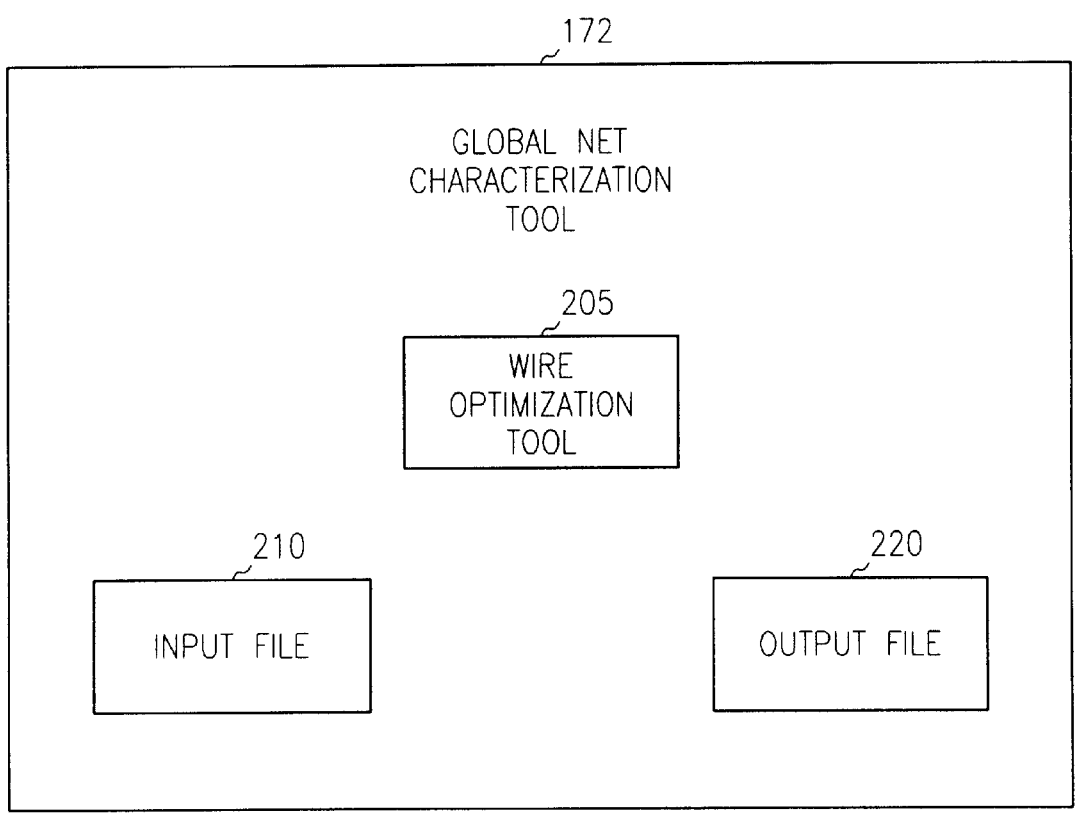
FIG. 2 depicts a block diagram of the global net characterization tool.

FIG. 2 depicts a block diagram of the global net characterization tool. Global net characterization tool 172 contains wire optimization instructions 205, input files 210 and output files 220. Wire optimization instructions are executable on processor 115. Global net characterization tool 172 reads input files 210 and produces output files 220. The operation of global net characterization tool 172 is further described below under the descriptions for FIGS. 3–9.

Figure 3:
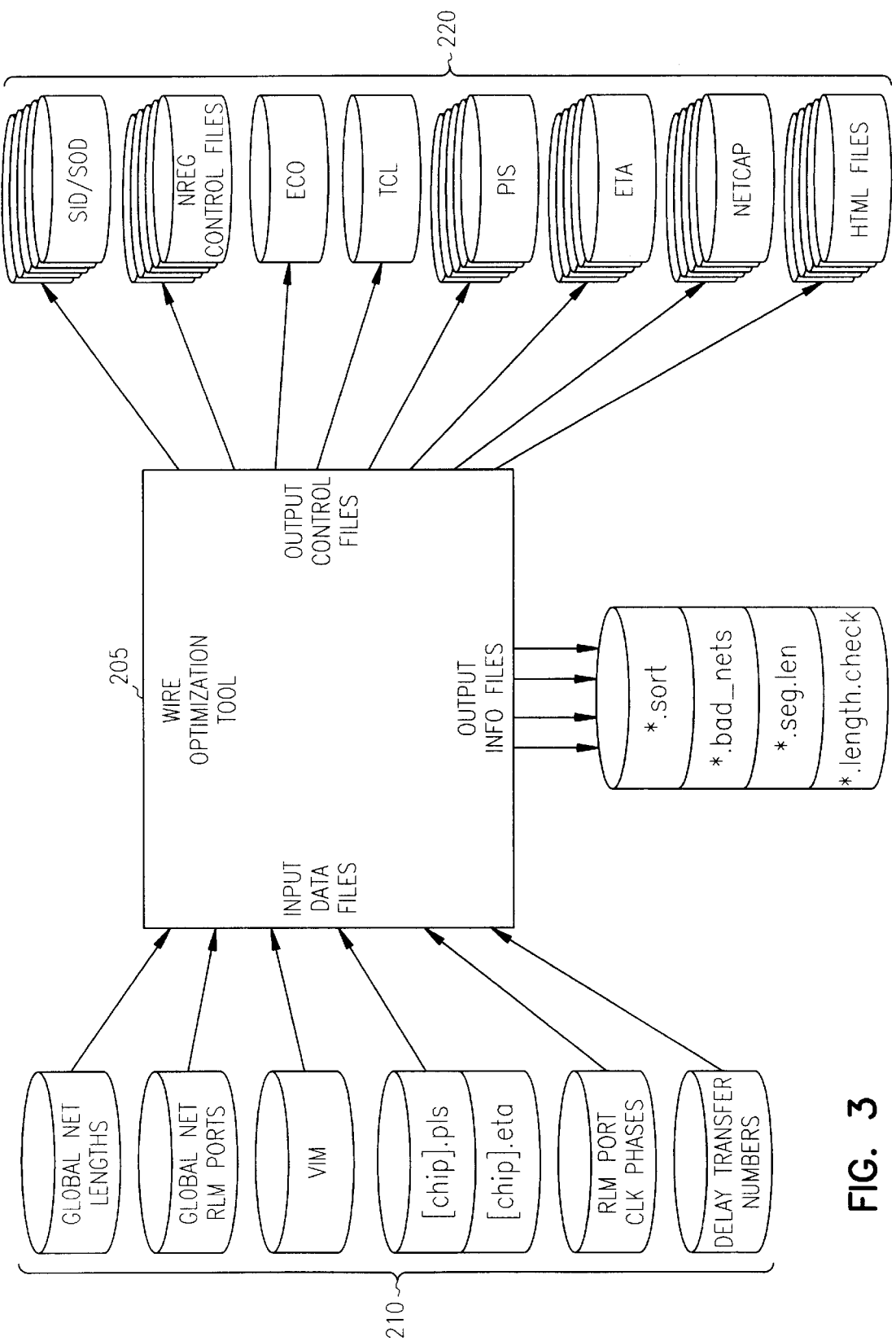
FIG. 3 depicts a block diagram showing data flow of the wire optimization algorithm within the global net characterization tool.

FIG. 3 depicts a block diagram showing data flow of global net characterization tool 172. Tool 172 receives input files 210 and produces output files 220.

Input files 210 include global net lengths, global net RLM (Random Logic Module) ports, VIM (VLSI Integrated Module), PIS (Primary Inputs Assertion File), ETA (Expected Time of Arrival), RLM port clock phases, and delay transfer numbers. VIM is the data format of logic design file 155.

Figure 4:
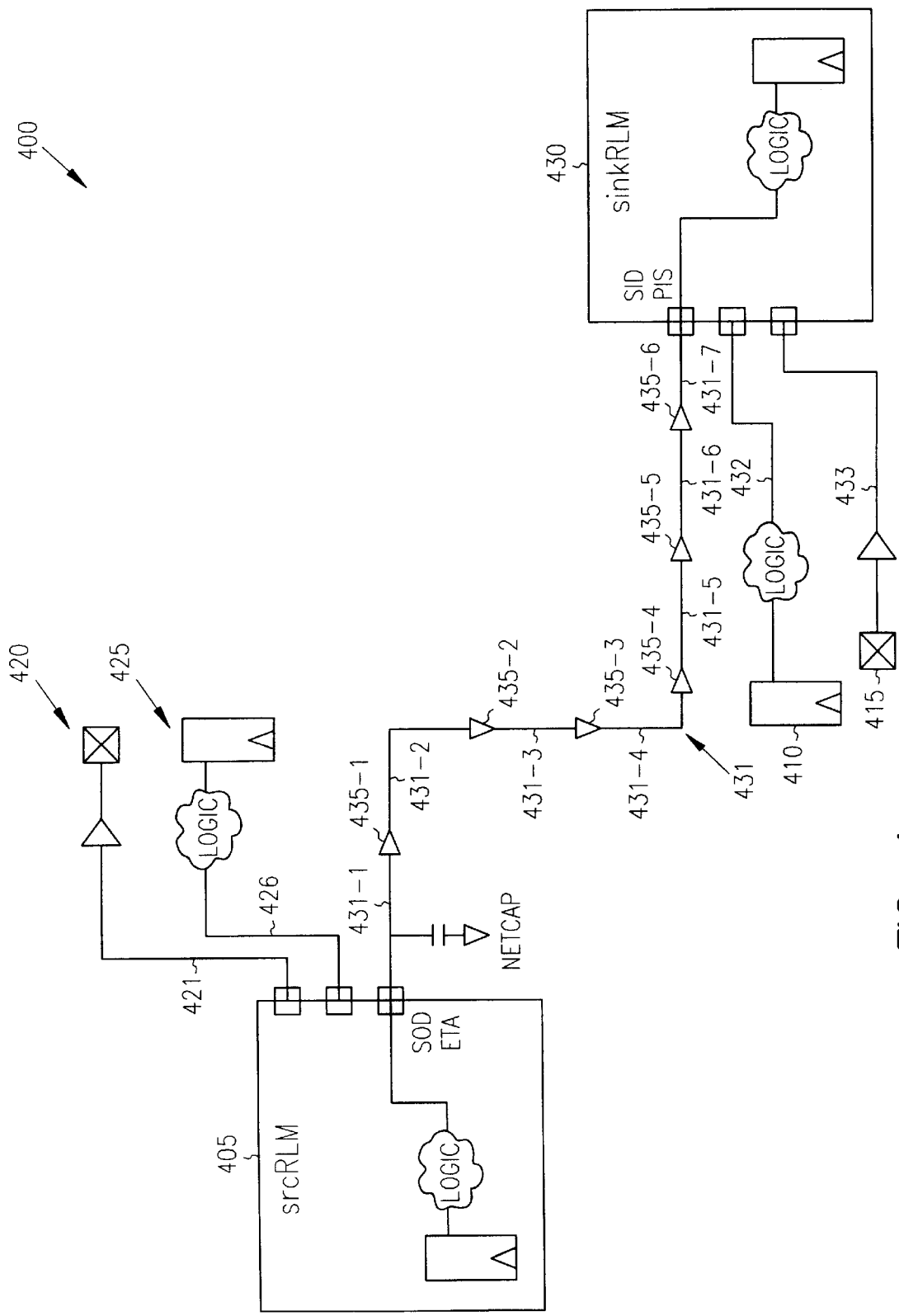
FIG. 4 depicts a block diagram of the results of the wire optimization algorithm.

Output files 220 include SID/SOD, NREG (N Register), ECO (Engineering Change Order), TCL (Tool Control Language), PIS, ETA, NETCAP (Net Capacitance), and HTML files. NETCAP is a file representing the net capacitance of the global net. ETA is a file containing data representing the input delay. Input delay is the time for the sink module to receive the signal. TCL is a file representing data that is input into cell placement tool 180. The NREG file contains a top-down specification of registers in a module FIG. 4 depicts a block diagram of the results of global net characterization tool 172 after the chip is manufactured using netlist 160. Electronic circuit 400 is illustrated.

Source RLM 405 is connected to sink I/O pad 420 via wire 421. Source RLM 405 is connected to sink latch 425 via wire 426. Source RLM 405 is connected to sink RLM 430 via wire 431. Source latch 410 is connected to sink RLM 430 via wire 432. Source I/O pad 415 is connected to sink RLM 430 via wire 433. Thus, source RLM 405, source latch 410, and source I/O pad 415 are all source components (or signal sources) of electronic circuit 400 while sink I/O pad 420, sink latch 425, and sink RLM 430 are all sink components (or signal receivers) of electronic circuit 400. Although RLM 405 is drawn as being exclusively a source RLM, it could be both a source and a sink RLM. Although RLM 430 is drawn as being exclusively a sink RLM, it could be both a source and a sink RLM. Further, electronic circuit 400 could contain many more electronic components than those drawn.

Tool 172 analyzes the logic design of electronic circuit 400 and inserts repeater buffers, such as buffers 435-1, 435-2, 435-3, 435-4, 435-5, and 435-6 and widens wires 421, 426, and 431, as necessary, to minimize the delay of signals across wires 421, 426, and 431. A repeater buffer is two inverters connected in sequence. A repeater buffer repowers the signal on the wire. The operation of tool 172 is further described below under the description for FIGS. 5–9.

Wire 431 is an example of a global net. Wire segments 431-1, 431-2, 431-3, 431-4, 431-5, 431-6, and 431-7 make up wire 431 and are connected by repeater buffers 435-1, 435-2, 435-3, 435-4, 435-5, and 435-6. The repeater buffers are shown as being evenly spaced on wire 431, i.e., the wire segments connecting the repeater buffers are all the same length. But, the repeater buffers could be unevenly spaced.

Figure 5:
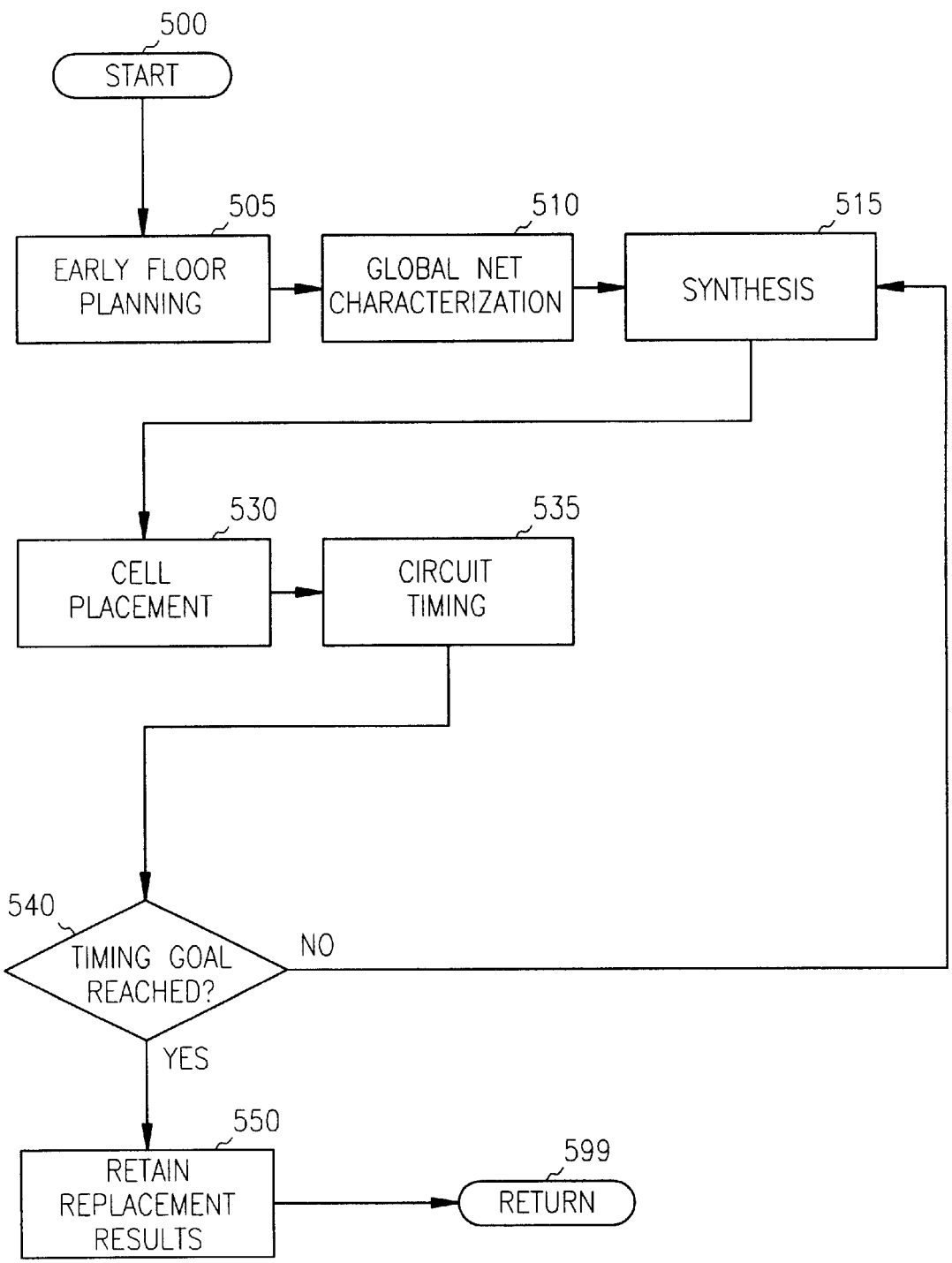
FIG. 5 depicts a flowchart that describes the operation of the logic design tool

FIG. 5 depicts a flowchart that describes the operation of an example embodiment of logic design tool 150. At block 500, control begins. Control then continues to block 505 where early floor planning occurs using floor planning tool 170. The logic designer submits logic design 155 to floor planning tool 170. Logic design 155 contains (1) an estimation of cell counts within each floor plan block; (2) floor plan documentation; (3) core level blocks stitched together (single fanout nets); (4) I/O types and C4 connections; and (5) decoupling capacitors. With this information as input, floor planning tool 170 builds the top level of the hierarchy. Contained in the top level are the floor plan blocks, I/O placements, and decoupling capacitors. Floor planning tool 170 places the core level blocks at the second level of the hierarchy and ungroups, or flattens, the core level. Floor planning tool 170 then calculates aspect ratios based on the logic design cell count estimations. Floor planning tool 170 places I/O or port locations of the floor plan blocks based on top-level connectivity. The floor plan is then assembled and finalized.

Control then continues to block 510 where global net characterization occurs. Tool controller 187 takes the output from floor planning tool 170 and uses it as input into global net characterization tool 172. Global nets connect each floor plan block together at the core or top level of the design. Global net characterization tool 172 analyzes each net by its length and applies one of two different algorithms in order to optimize the delay of the net length. Each algorithm guards against slew rate violations and then optimizes the speed of the net. The first algorithm concentrates on using more repeater cell insertions to optimize on net delay. The second algorithm uses more double-wide metal in addition to repeaters for delay optimization. Thus, the optimization algorithms of global net characterization tool 172 modify the global net in order to minimize the delay of signals across the global net.

Finally, global net characterization tool 172 reads the output and input timing reports, converts delay into numbers, and places the results in ETA (Estimated Time of Arrival) and PIS (Primary Inputs Delay File) file format. Global net characterization tool 172 creates the SID/SOD port timing numbers and the PIS/ETA assertion files and converts the synthesis clock definition to a phase file. Capacitive assertion (POS) is carried forward in order to control drive cell affinity to port locations. Output loading is used to draw the driving port cell (cell affinity) close to the output port.

The output of global net characterization tool 172 consists of tool-constraint files for all floor plan blocks. The operation of global net characterization tool 172 is further described below under the description for FIGS. 6–9.

Control then continues to block 515 where synthesis occurs. Tool controller 187 takes the floor plan block that is output from global net characterization tool 172 and uses it as input to synthesis tool 174. Synthesis takes place within the floor plan block. There can also be synthesis at sub-levels of hierarchy within the floor plan block. Global net characterization tool 172 provides customized templates to the logic designer for items such as clock rate, uncertainty, and input/output delays for each floor plan block. These templates could be further modified by the logic designer depending on the design requirements. Synthesis tool 174 obtains real timing delay values in place of wire load modeling. After these values are obtained, synthesis tool 174 fixes real timing violations instead of false wire load-induced timing violations.

Synthesis tool 176 assigns physical design attributes, performs cleanup routines, writes out ASIC (Application Specific Integrated Circuit) sanity checks to an output file, and generates VIM (VLSI integrated module). Because of the inclusion of the port characterizations done in early floor planning 505, these values are contained in the input and output port timing reports.

Synthesization tool 174 produces as output a design EDIF (Electronic Design Interchange Format) file, which is an industry standard format for a netlist. But, any suitable format for the netlist could be used.

Control then continues to block 530 where cell placement occurs. Tool controller 187 transfers the output of global net characterization tool 172 to the input of cell placement tool 180. Cell placement tool 180 reads the design (including the floor plan block size and port locations), reads assertions, performs cell placement with capacitive target generation (timing-driven layout), writes out VIM (contains cell placement information), and writes out RC to be used for synthesis back annotation. In the event that the interface to the RLM was changed, VIMDEF is compared to a VIM physical and any RPIN's are removed that do not have a corresponding DPIN. A RPIN is added if a new DPIN exists. This effectively keeps all other relevant physical information intact between design iterations.

Control then continues to block 535 where circuit timing occurs. Tool controller 187 transfers the output of cell placement tool 180 to the input of circuit timing tool 176. Circuit timing tool 176 uses knowledge of cell location and routing information from the cell placement tool 180 to extract capacitance and resistance for all nets. It also uses PIS, ETA, and netcap files generated by global net characterization tool 172 to characterize the input and output ports of the floorplan block. From all of this information, circuit timing tool 176 computes the time required by all nets within the floorplan block and marks the nets that do not meet the timing goals.

Control then continues to block 540 where tool controller 187 determines whether the timing goal is reached. The time it takes a signal to propagate through a component, such as a logic gate, is typically referred to as the "gate delay". The delay associated with the interconnect for connecting one gate to another is typically referred to as the "interconnect delay". The combination of these two delays is typically referred to as "wire delay" or "timing." The interconnect delay depends on the resistance and capacitance of the conductive paths between gates. Further, the interconnect delay depends on driving characteristics of the gate or gates which are used to drive the interconnect. The driving characteristics of a gate include the slope of the gate output signal when the gate is transitioned from one value to another, such as from one logic state (e.g., logic level "0") to another logic state (e.g., logic level "1"), or vice versa. The timing goal is reached when the timing of each operation carried out by the logic design will fit within one clock cycle. If the timing goal is reached, then control continues to block 550 where controller 150 retains the cell placement results in netlist 160.

If the timing goal is not reached, then control returns to block 515 as tool controller 187 back annotates the placing, routing, and timing information to synthesis tool 174, which can now perform accurate decisions based on this information and can tune the circuits to operate within the target clock period. For example, synthesis tool 174 can adjust the drive strengths to drive real metal loads. Synthesis tool 174 can re-synthesize combinational logic to operate more efficiently within a clock period. Synthesis tool 174 can lower the drive strength to certain cells in order to reduce power consumption. Synthesis tool 174 can re-buffer or repeat large fanout trees to avoid timing and slew-related issues. Thus, using back annotation of placing, routing, and timing information, synthesis tool 174 can operate under real-world conditions otherwise not represented by a wireload model.

Figure 6A:
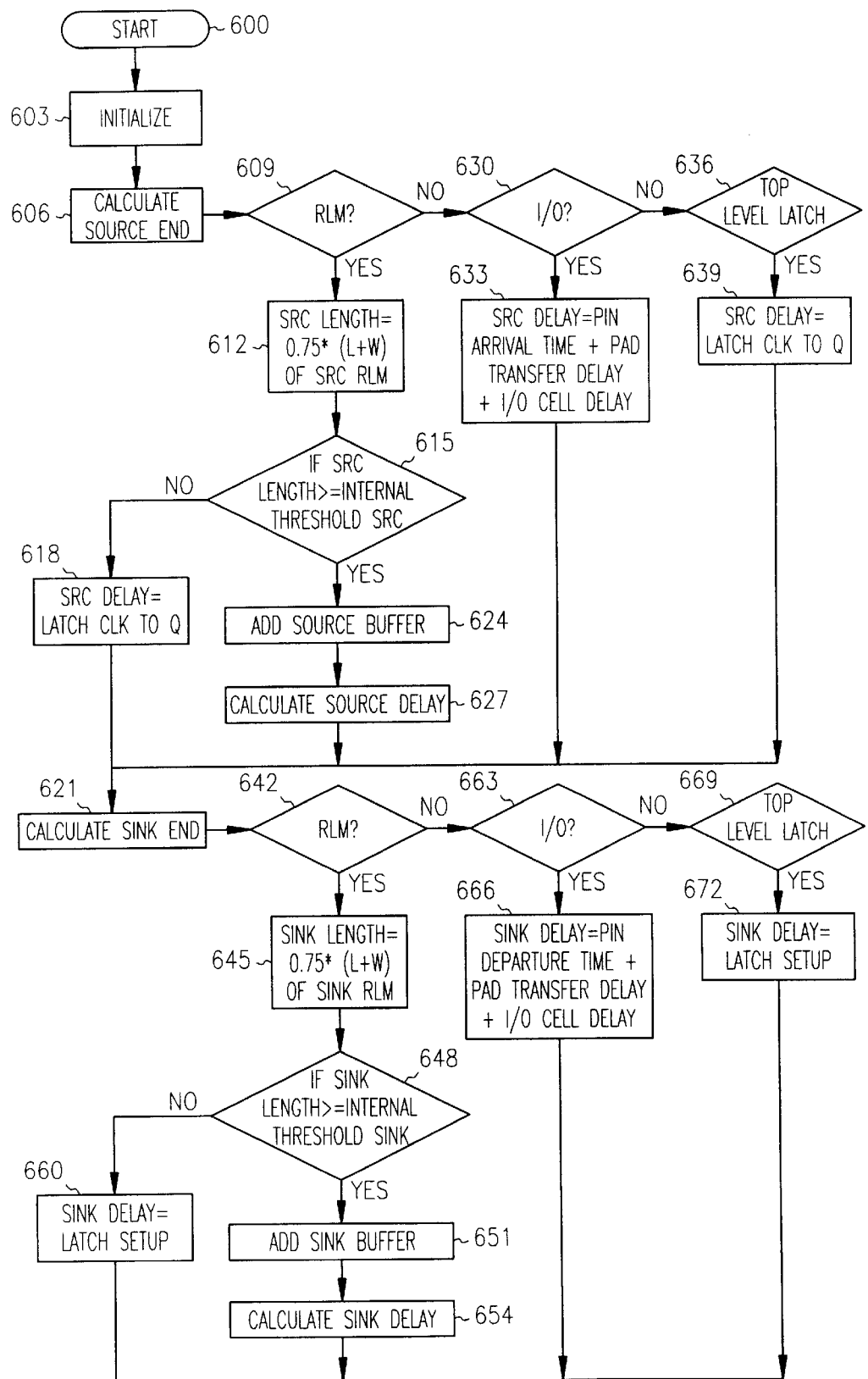
FIGS. 6, 7, 8, and 9 depict flowcharts that describe the operation of the wire optimization algorithm within the net characterization tool.
Figure 6B:
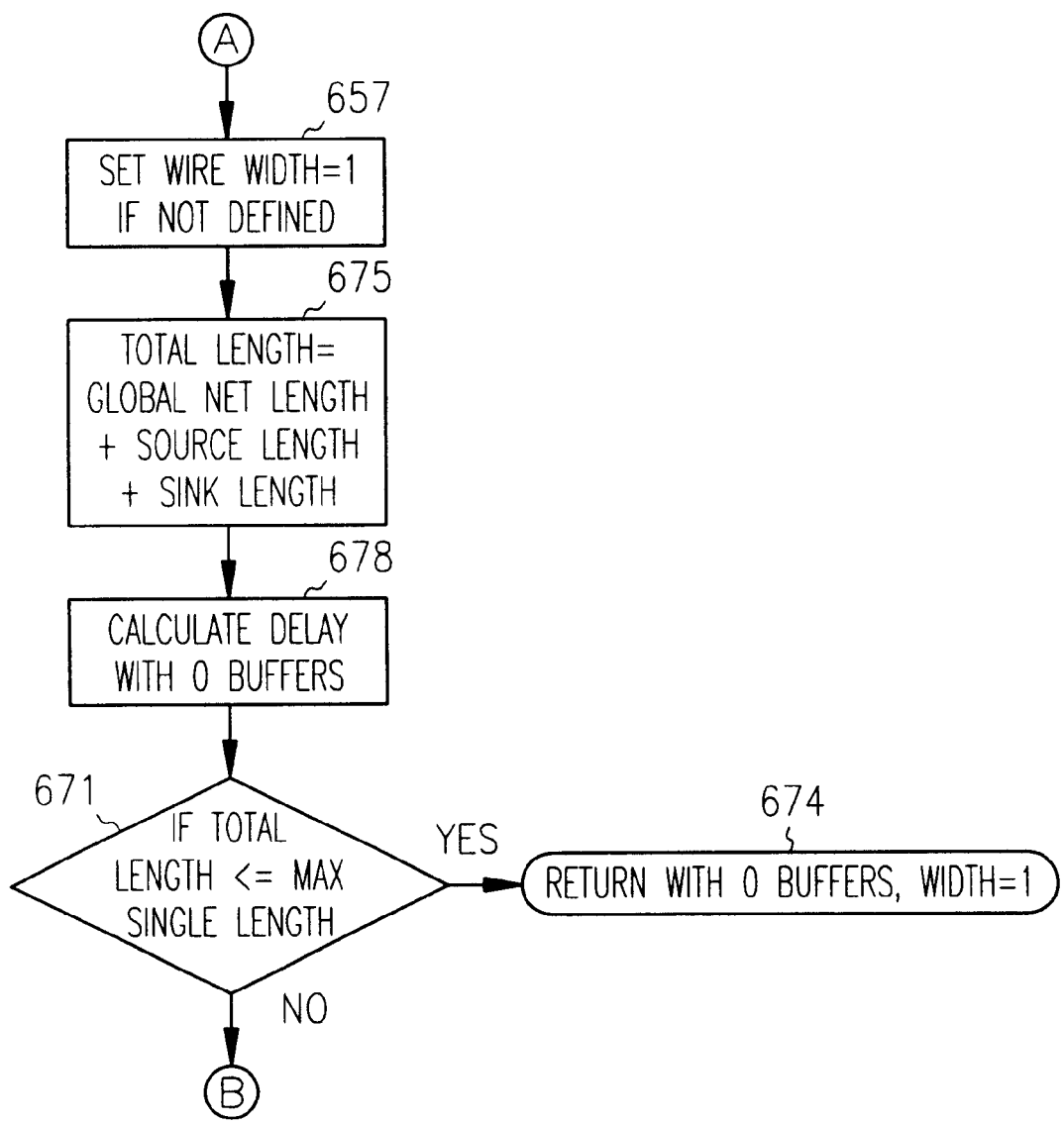

FIG. 6 depicts a flowchart that describes the wire optimization algorithm of net characterization tool 172, which determines the number of repeater buffers and wire width for each global net. Adding repeater buffers to a wire reduces the delay of a signal across the wire because the delay is a function of the square of the wire length. Thus, the delay of one wire segment without repeater buffers is:

$KRCL^2$, where K is a constant to accommodate coupling with neighboring wires, R is the resistance per-unit-length, C is the capacitance per-unit-length, and L is the length of the wire segment.

But, the delay of two wire segments, each half has long as the original, with a repeater buffer connecting them is:

$2KRC(L/2)^2$+buffer delay=½ $KRCL^2$+buffer delay<$KRCL^2$. This holds true so long as the buffer delay is less than ½ $KRCL^2$.

Widening the wire width reduces the delay of a signal across the wire because the delay of the wire is proportional to RC (resistance of the wire multiplied by capacitance). Thus, the RC product of the double-wide wire is lower than the RC product of a single-wide wire due to the wider cross-section of the double-wide wire, which lowers the resistance.

The logic of FIG. 6 is executed once for every wire path in logic design 155. Control begins at block 600. Control then continues to block 603 where tool 172 initializes its internal variables. Control then continues to block 606 where tool 172 calculates the type of module that is the source on the current wire path being processed. Tool 172 performs different processing depending on the type of source module, which can be one of an RLM module, an I/O pad, or a top level latch. An example of a source RLM module is shown in FIG. 4 as element 405. An example of an I/O pad is shown in FIG. 4 as element 415. An example of a top level latch is shown in FIG. 4 as element 410.

Referring again to FIG. 6, control then continues to block 609 where tool 172 determines if the source module calculated in block 606 is a RLM module. If the determination at block 609 is true, then control continues to block 612 where tool 172 calculates the source length of the wire to be 0.75 multiplied by the sum of the length and the width of the source RLM module. Tool 172 does this calculation in order to gain a pessimistic estimate of the length of the wire within the source RLM module. Control then continues to block 615 where tool 172 determines whether the source length of the wire is greater than the source internal threshold, which is a predetermined constant that sets a limit on the RLM size over which a buffer will be added at the port. If the determination at block 615 is false, then control continues to block 618 where tool 172 sets the source delay to be the latch clock to Q, which is the time from the arrival of the clock trigger edge at the latch to the time the data (Q) is output from the latch. Control then continues to block 621, as described below.

If the determination at block 615 is true, then control continues to block 624 where tool 172 adds a source repeater buffer to the wire path. Thus, tool 172 adds a source buffer near the output of source RLM 405 when source RLM 405 is large in order to buffer the possible long wire within source RLM 405. An example of a source repeater buffer is shown as element 435-1 in FIG. 4. Referring again to FIG. 6, control then continues to block 627 where tool 172 calculates the source delay of one wire segment using the formula: $KRCL^2$+latch clock to Q. In this formula, K is a constant to accommodate coupling with neighboring wires, R is resistance per unit length of wire, C is capacitance per unit length of wire, and L is the length of the wire segment. Control then continues to block 621, as described below.

If the determination at block 609 is false, the control continues to block 630 where tool 172 determines whether the source module calculated in block 607 is an I/O pad. If the determination at block 630 is true, then control continues to block 633 where tool 172 calculates the source delay time to be the pin arrival time plus the pad transfer delay plus the I/O cell delay. Control then continues to block 621, as described below.

If the determination at block 630 is false, then control continues to block 636 where tool 172 determines that the source module calculated in block 607 is a top level latch. Control then continues to block 639 where tool 172 sets the source delay time to be the latch clock to Q. Control then continues to block 621.

At block 621, tool 172 calculates the type of module that is the sink module on the current wire path being processed, which can be one of an RLM module, an I/O pad, or a top level latch.

Control then continues to block 642 where tool 172 if the sink module calculated in block 621 is a RLM module. If the determination at block 642 is true, then control continues to block 645 where tool 172 calculates the source length of the wire to be 0.75 multiplied by the sum of the length and the width of the sink RLM module. Tool 172 does this calculation in order to gain a pessimistic estimate of the length of the wire within the sink RLM module. Control then continues to block 648 where tool 172 determines whether the sink length of the wire is greater than the sink internal threshold, which is a predetermined constant that sets a limit on RLM size of which a buffer will be added at the port. If the determination at block 648 is false, then control continues to block 660 where tool 172 sets the sink delay to be the setup time of the latch that is inside the sink RLM. The setup time is the length of time that the data must arrive before the triggering clock edge. Control then continues to block 657, as described below.

If the determination at block 648 is true, then control continues to block 651 where tool 172 adds a sink repeater buffer to the wire path. Thus, tool 172 adds a sink repeater buffer near the input of sink RLM 430 when sink RLM 430 is large in order to buffer the possible long wire within sink RLM 430. An example of a sink repeater buffer is shown as element 435-6 in FIG. 4. Referring again to FIG. 6, Control then continues to block 654 where tool 172 calculates the sink delay using the formula $KRCL^2$ plus the latch setup time. Control then continues to block 657, as described below.

If the determination at block 642 is false, the control continues to block 663 where tool 172 determines whether the sink module calculated in block 621 is an I/O pad. If the determination at block 663 is true, then control continues to block 666 where tool 172 calculates the sink delay time to be the pin departure time plus the pad transfer delay plus the I/O cell delay. Control then continues to block 657, as described below.

If the determination at block 663 is false, then control continues to block 669 where tool 172 determines that the source module calculated in block 621 is a top level latch. Control then continues to block 672 where tool 172 sets the sink delay time to be the latch setup time. Control then continues to block 657.

At block 657, tool 172 sets the width of the wire to be 1 wiring track if the wire width has not been previously defined. A wiring track is the minimum width of a wire in the chip technology. Control then continues to block 675 where tool 172 sets the total wire length to be the global net length plus the source length plus the sink length. The global net length would be the length of wire 421, 426, 431, 432, or 433, depending on the example being processed. Control then continues to block 678 where tool 172 calculates the time delay if the wire has no repeater buffers. The time delay is calculated using the formula: $KRCL^2$. Control then continues to block 671 where tool 172 determines if the total wire length is less than or equal to the maximum single wire length. The maximum single length wire is a constant below which it is not necessary to add buffers because the wire can meet the timing goal without them. If the determination at block 671 is true, then control continues to block 674, where tool 172 returns zero buffers and a wire width of one.

Figure 7A:
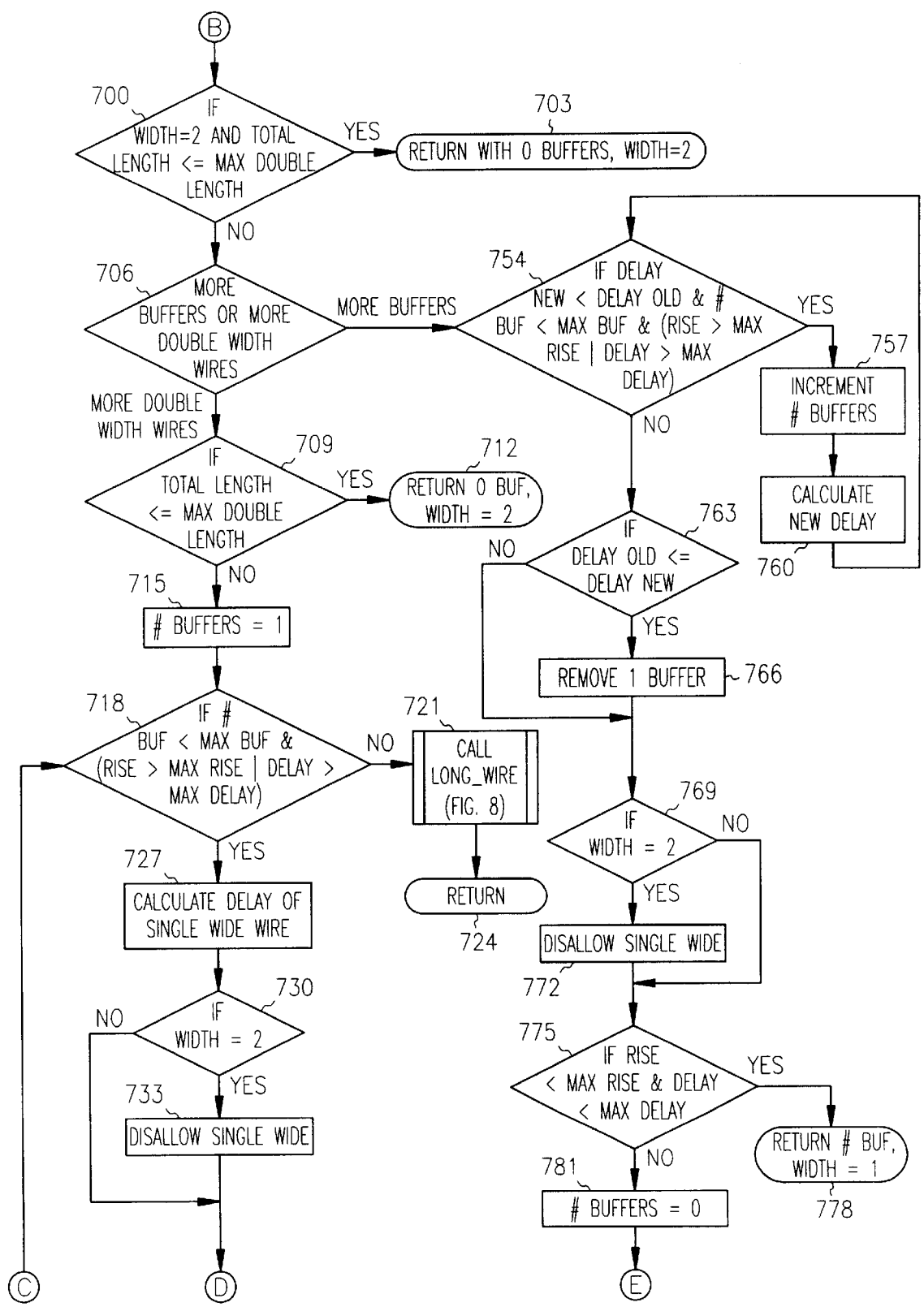
Figure 7B:
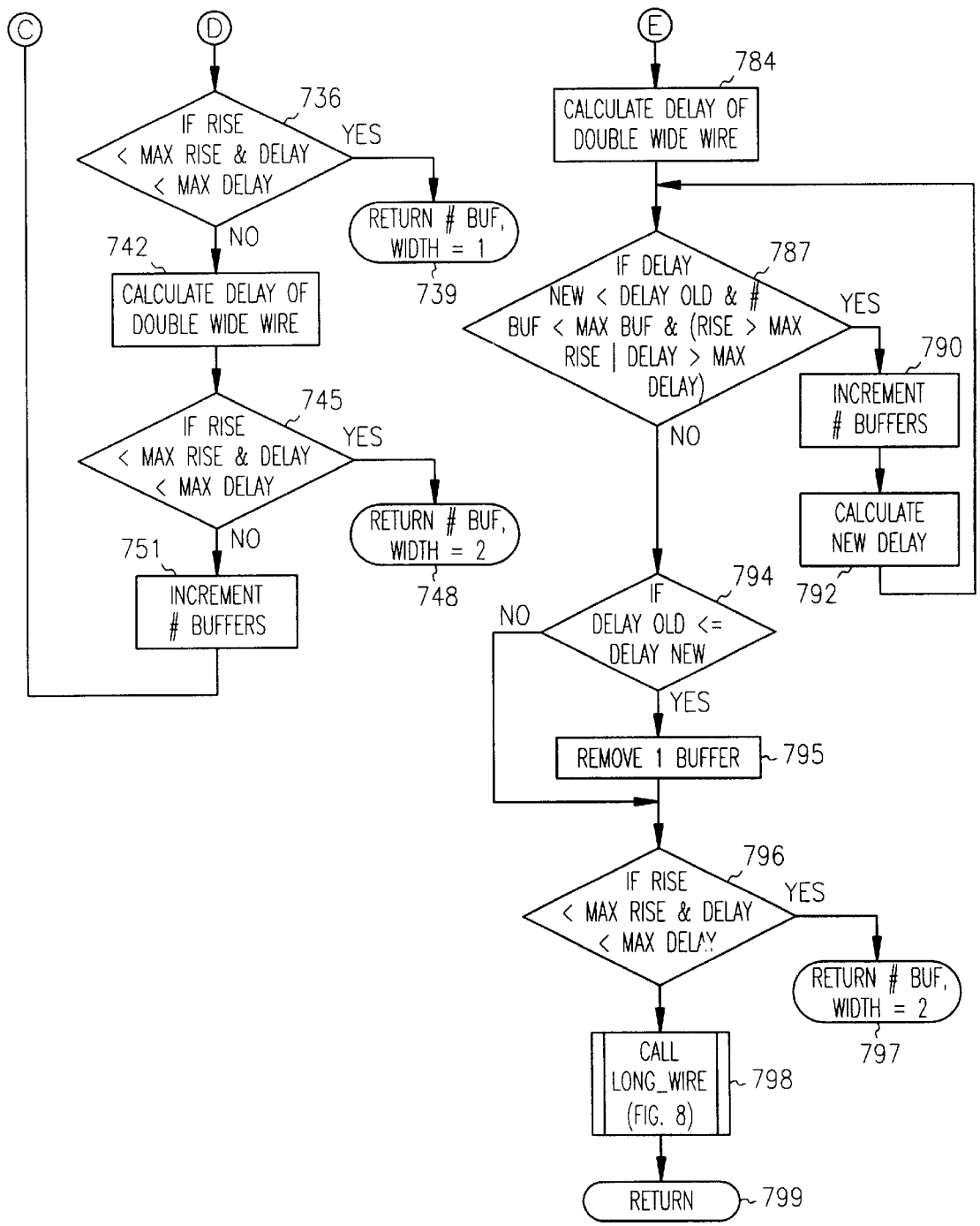

If the determination at block 671 is false, then control continues to block 700 in FIG. 7. At block 700, tool 172 determines if the wire width is two and if the total wire length is less than or equal to the maximum double length. If the determination at block 700 is true, then control continues to block 703 where tool 172 returns zero buffers and a wire width of two.

If the determination at block 700 is false, then control continues to block 706 where tool 172 determines whether more buffers are needed or more double width wires are needed based on an input option. If more double width wires are needed, then control continues to block 709 where tool 172 determines if the total length of the wire is less than or equal to the maximum double length, which is an input parameter below which it is not necessary to add buffers because the wire can meet the timing goal without them. If the determination at block 709 is true, then control continues to block 712 where tool 172 returns zero buffers and a wire width of two. If the determination at block 709 is false, then control continues to block 715 where tool 172 sets the number of repeater buffers to one.

Control then continues to block 718 where tool 172 determines if the number of buffers is less than the maximum number of buffers and (the rise of the wire due to the capacitive load is greater than the maximum capacitance rise or the time delay is greater than the maximum delay). If the determination at block 718 is true, then control continues to block 721 where the long wire routine of tool 172 is called, as further described below under the description for FIGS. 8 and 9. Control then continues to block 724 where tool 172 returns.

If the determination at block 718 is false, then control continues to block 727 where tool 172 calculates the delay of a single-width wire. The time delay is calculated using the formula: $KRCL^2$. Control then continues to block 730 where tool 172 determines if the wire width is two. If the determination at block 730 is true, then control continues to block 733 where tool 172 disallows a single-wide wire. Control then continues to block 736. If the determination at block 730 is false, then control continues directly to block 736.

At block 736, tool 172 determines if the capacitance rise is less than the maximum rise and the time delay is less than the maximum delay. The capacitance rise is calculated using the formula: $RCL^2+RC_{load}L$. If the determination at block 736 is true, then control continues to block 736 where tool 210 returns the number of buffers and a wire width of one.

If the determination at block 736 is false, then control continues to block 742 where tool 172 calculates the time delay of the double-wide wire. Control then continues to block 745 where tool 172 determines if the capacitance rise is less than the maximum rise and the time delay is less than the maximum delay. If the determination at block 745 is true, then control continues to block 748 where tool 172 returns the number of buffers and a wire width of two.

If the determination at block 745 is false, then control continues to block 751 where tool 172 increments the number of buffers by one. Control then returns to block 718, as previously described above.

If the determination at block 706 is that more buffers are needed, then control continues to block 754 where tool 172 determines if the new time delay is less than the old time delay and the number of buffers is less than the maximum number of buffers and (the capacitance rise is greater than the maximum capacitance rise or the time delay is greater than the maximum delay.) If the determination at block 754 is true, the control continues to block 757 where tool 172 increments the number of buffers by one. Control then continues to block 760 where tool 172 calculates a new time delay based on the new number of buffers. Control then continues to block 754 as previously described above.

If the determination at block 754 is false, then control continues to block 763 where tool 172 determines of the old time delay is less than or equal to the new time delay. If the determination at block 763 is true, then control continues to block 766 where tool 172 removes 1 buffer from the wire. Control then continues to block 769. If the determination at block 763 is false, then control continues directly to block 769.

At block 769, tool 172 determines of the wire width is equal to two. If the determination at block 769 is true, then control continues to block 772 where tool 172 disallows a single-width wire. Control then continues to block 775. If the determination at block 769 is false, then control continues directly to block 775.

At block 775, tool 172 determines if the capacitance rise time is less than the maximum rise and the time delay is less than the maximum delay. The capacitance rise time is calculated using the formula: $RCL^2+RC_{load}L$. The rise time is the maximum of all the segment rise times. The maximum rise time is an input constant that insures that the signal will switch quickly enough. If the determination at block 775 is true, then control continues to block 778 where tool 172 returns the number of buffers and a wire width of one If the determination at block 775 is false, then control continues to block 781 where tool 172 sets the number of buffers to be zero. Control then continues to block 784 where tool 172 calculates the delay of the double-width wire. Control then continues to block 787 where tool 172 determines if the new delay is less than the old delay and the number of buffers is less than the maximum number of buffers and (the capacitance rise is greater than the maximum rise or the time delay is greater than the maximum delay.) If the determination at block 787 is true, then control continues to block 790 where tool 172 increments the number of buffers by one. Control then continues to block 792 where tool 172 calculates a new delay based on the new number of buffers. Control then returns to block 787, as previously described above.

If the determination at block 787 is false, then control continues to block 794 where tool 172 determines if the old delay is less than or equal to the new delay. If the determination at block 794 is true, then control continues to block 795 where tool 172 removes 1 buffer from the wire. Control then continues to block 796. If the determination at block 794 is false, then control continues directly to block 796.

At block 796, tool 172 determines if the capacitance rise is less than the maximum capacitance rise and the time delay is less than the maximum delay. If the determination at block 796 is true, then control continues to block 797 where tool 172 returns the number of buffers and a wire width of two. If the determination at block 796 is false, then control continues to block 798 where the long wire function is called, as further described below under the description for FIGS. 8 and 9. Control then continues to block 799 where tool 172 returns.

Figure 8:
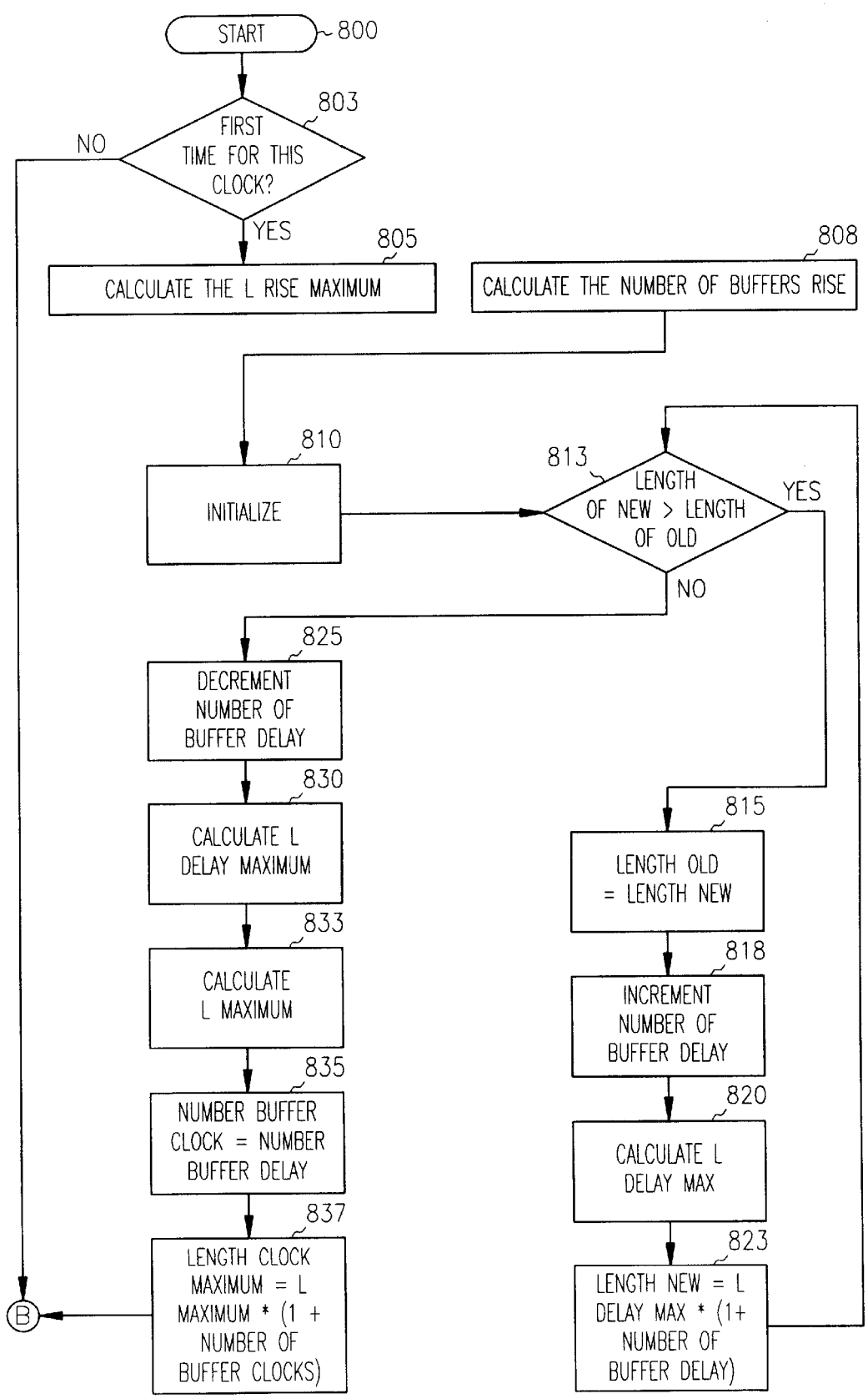

FIG. 8 depicts a flowchart that describes the operation of the long wire routine. "L" is used here to mean the length of a wire segment, and "len" is used to mean the length of the entire net. Control begins at block 800. Control then continues to block 803 where tool 172 determines whether this is the first time this routine has been called for this clock domain. If the determination at block 803 is true, then control continues to block 805 where tool 172 calculates $L_{rise}$ max using the following formula: maximum{$(R_d C_{load}+\text{-square root}[(R_d C_{load})^2+4R_d C_d(t_{rise}\text{max})])/(2R_d C_d)$}.

$R_d$ is the resistance per unit length of a double-wide wire. $C_{load}$ is the capacitance of the load, which is the repeater buffer. $C_d$ is the capacitance per unit length of a double-wide wire. $t_{rise}$ max is the maximum rise time allowed, i.e., the maximum time for the signal to rise from 10% to 90% of the power (high) voltage. $L_{rise}$ max is the maximum length of a wire segment that still meets the rise time constraint.

Control then continues to block 808 where tool 172 calculates the number of $\text{buffer}_{sise}$ using the following formula: integer{[clock–skew–(clock to Q)–setup time]/[buffer delay+$K_d R_d C_d$-($L_{rise}$max)$^2$]−1}.

Clock is the time for one complete clock cycle. Skew is the uncertainty in the arrival time of the clock. This is a result of one clock signal being distributed throughout the chip. The ideal situation would be for the signal to arrive at all blocks at the same time, but due to a non-ideal clock distribution network, there is uncertainty in the arrival time of the clock signal at each block, which is called skew. The effect of skew is to reduce the portion of the clock period allowed for logic or wire delay. Clock to Q is the time for the signal to leave the source latch after the clock arrives. Setup is the time the signal must arrive at the sink latch before the clock arrives. Buffer delay is the time delay for the signal to pass through one repeater buffer. $K_d$ is a constant to accommodate coupling with neighboring wires.

Control then continues to block 810 where tool 172 initializes its internal variables. Control then continues to block 813 where tool 172 determines whether the length of new>length of old.

If the determination at block 813 is true, the control continues to block 815 where tool 172 sets $\text{len}_{old}=\text{len}_{new}$. Control then continues to block 818 where tool 172 increments number of $\text{buffers}_{delay}$. Control then continues to block 820 where tool 172 calculates $L_{delay}$ max=square root{[clk−skew−(clk to Q)−setup−(1+number of $\text{buffers}_{delay}$)*buffer delay]/[(1+number of $\text{buffers}_{delay}$)*$K_d R_d C_d$]}.

$L_{delay}$ max is the maximum length of a segment for the given number of $\text{buffers}_{delay}$. Number of $\text{buffers}_{delay}$ is (when the iteration is finished) the number of buffers that gives the maximum net length consistent with the delay restrictions of the net.

Control then continues to block 823 where tool 172 calculates $\text{len}_{new}=L_{delay}$ max*(1+number of $\text{buffers}_{delay}$). Control then returns to block 813 as previously described above.

If the determination at block 813 is false, the control continues to block 825 where tool 172 decrements the number of $\text{buffers}_{delay}$. Control then continues to block 830 where tool 172 calculates $L_{delay}$ maximum. Control then continues to block 833 where tool 172 calculates $L_{max}$=minimum[$L_{rise}$ max, $L_{delay}$ max]. $L_{max}$ is the maximum wire segment length consistent with both the rise time and delay constraints.

Control then continues to block 835 where tool 172 sets number of $\text{buffers}_{clk}$=number of $\text{buffers}_{delay}$. Number of $\text{buffer}_{sclk}$ is the number of buffers that allows the net to span the maximum length within one period of that clock consistent with both rise time and delay constraints Control then continues to block 837 where tool 172 calculates $\text{len}_{clk}$ max=$L_{max}$*(1+number of $\text{buffers}_{clk}$). $\text{Len}_{clk}$ max is the maximum length that can be spanned within one period of that clock consistent with both rise time and delay constraints. It is a function of $L_{max}$ and number of $\text{buffers}_{clk}$.

Figure 9:
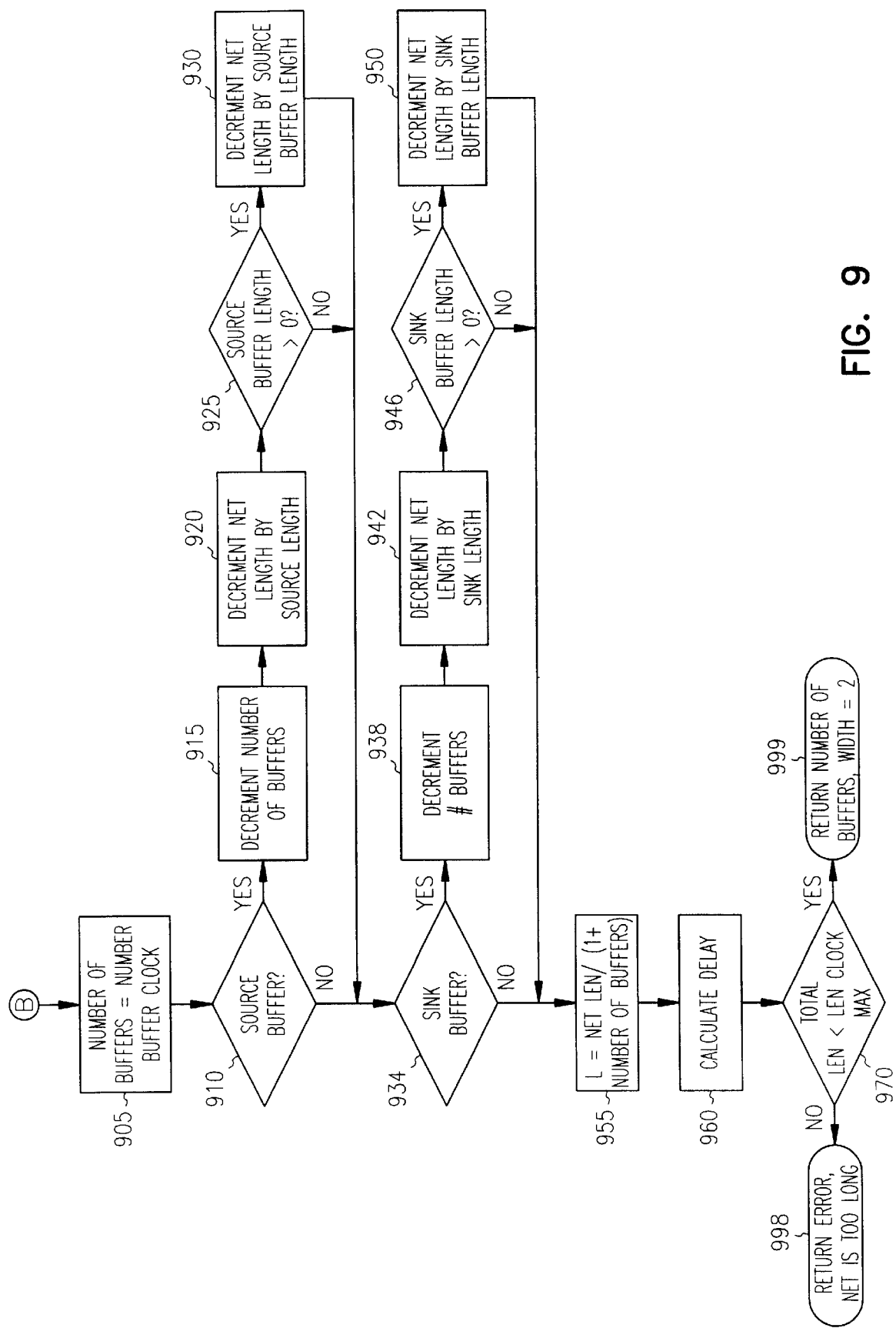

Control then continues to block 905 of FIG. 9 where tool 172 sets the number of buffers equal to the number of $\text{buffers}_{clk}$. Control then continues to block 910 where tool 172 determines whether the buffer being processed is a source buffer.

If the determination at block 910 is true, then control continues to block 915 where tool 172 decrements the number of buffers. Control then continues to block 920 where tool 172 decrements net length by the source length. Control then continues to block 925 where tool 172 determines whether the source buffer length is greater than zero. If the determination at block 925 is true, then control continues to block 930 where tool 172 decrements net length by the source buffer length. Control then continues to block 934, as described below. If the determination at block 925 is false, then control continues directly to block 934.

If the determination at block 910 is false, then control continues to block 934 where tool 172 determines whether the buffer being processed is a sink buffer. If the determination at block 934 is true, then control continues to block 938 where tool 172 decrements the number of buffers. Control then continues to block 942 where tool 172 decrements net length by the sink length. Control then continues to block 946 where tool 172 determines whether the sink buffer length is greater than zero. If the determination at block 946 is true, then control continues to block 950 where tool 172 decrements the net length by the sink buffer length. Control then continues to block 955, as described below. If the determination at block 946 is false, then control continues directly to block 955.

If the determination at block 934 is false, then control continues to block 955 where tool 172 calculates L=netlen/(1+number of buffers). Control then continues to block 960 where tool 172 calculates the delay. Control then continues to block 970 where tool 172 determines whether the total length is less than the $\text{len}_{clk}$ maximum. If the determination at block 970 is false, then control continues to block 998 where the function returns an error because the net is too long. If the determination at block 970 is true, then control continues to block 999 where the function returns the calculated number of buffers and a wire width of 2.

Conclusion

The present invention provides a method, system, and program product for designing an electronic circuit. The electronic circuit has a source component, a sink component and a wire connecting the source and sink components. In one aspect, the wire is divided into wire segments and repeater buffers are added to connect the wire segments. The number of buffers is based on the calculated delay of the global net. In another aspect, the metal routes of the wire are widened to reduce delays on a global net. Thus, the invention automatically designs wire interconnects in an electronic circuit, so that the timing goal of the circuit is met, and operations in the electronic circuit will complete within one clock cycle. This saves the electrical engineer designing the circuit from the cumbersome, expensive, and time-consuming task of re-designing the electronic circuit to meet the timing goal.

The above description is intended to be illustrative, and not restrictive. Although numerous characteristics and advantages of various embodiments of the present invention have been set forth in the foregoing description, together with details of the structure and function of various embodiments, many other embodiments and changes to details will be apparent to those of skill in the art upon reviewing the above description. The scope of the invention should, therefore, be determined with reference to the appended claims, along with the full scope of equivalents to which such claims are entitled.

What is claimed is:

1. A computer-executed method for designing an electronic circuit comprising a source component, a sink component and a plurality of wire segments connecting the source and sink components, wherein the method comprises:
   calculating a number of repeater buffers to connect the wire segments, wherein the number is optimized to meet a timing goal of the electronic circuit, and wherein the calculating is based on a capacitance rise wherein the capacitance rise is determined based on a capacitance, a resistance, and a length of at least one of the wire segments; and
   adding the buffers to a netlist.

2. The method of claim 1, further comprising:
   widening a width of the wire segments, wherein the width is optimized to meet the timing goal of the electronic circuit.

3. The method of claim 1, wherein the repeater buffer comprises:
   two inverters connected in series.

4. The method of claim 1, wherein the timing goal is met when an operation will complete in less than one clock cycle.

5. The method of claim 1, further comprising:
   when the source component is a random logic module, determining whether to add a source buffer based on the length and width of the source component.

6. The method of claim 1, further comprising:
   when the sink component is a random logic module, determining whether to add a sink buffer based on the length and width of the source component.

7. The method of claim 1, wherein the calculating step optimizes the number of repeater buffers based on the resistance, length, and capacitance of the wire.

8. A program product for designing an electronic circuit comprising a source component, a sink component and a plurality of wire segments connecting the source and sink components, wherein the program product comprises a signal-bearing media bearing instructions, wherein the instructions, when executed by a computer, comprise:
   calculating a number of repeater buffers to connect the wire segments, wherein the number is optimized to meet a timing goal of the electronic circuit, and wherein the calculating is based on a capacitance rise wherein the capacitance rise is determined based on a capacitance, a resistance, and a length of at least one of the wire segments; and
   adding the buffers to a netlist.

9. The program product of claim 8, further comprising:
   widening a width of the wire segments, wherein the width is optimized to meet the timing goal of the electronic circuit.

10. The program product of claim 8 wherein the repeater buffer comprises:
    two inverters connected in series.

11. The program product of claim 8 wherein the timing goal is met when an operation will complete in less than one clock cycle.

12. The program product of claim 8 further comprising:
    when the source component is a random logic module, determining whether to add a source buffer based on the length and width of the source component.

13. The program product of claim 8 further comprising:
    when the sink component is a random logic module, determining whether to add a sink buffer based on the length and width of the source component.

14. The program product of claim 8 wherein the calculating element optimizes the number of repeater buffers based on the resistance, length, and capacitance of the wire.

15. A computer system for designing an electronic circuit comprising a source component, a sink component and a plurality of wire segments connecting the source and sink components, wherein the computer system comprises:
    a processor; and
    memory coupled to the processor, wherein the memory contains instructions, which when executed on the processor comprise:
       calculating a number of repeater buffers to connect the wire segments, wherein the number is optimized to meet a timing goal of the electronic circuit, and wherein the calculating is based on a capacitance rise wherein the capacitance rise is determined based on a capacitance, a resistance, and a length of at least one of the wire segments, and
       adding the buffers to a netlist.

16. The computer system of claim 15, further comprising:
    widening a width of the wire segments, wherein the width is optimized to meet the timing goal of the electronic circuit.

17. The computer system of claim 15 wherein the repeater buffer comprises:
    two inverters connected in series.

18. The computer system of claim 15 wherein the timing goal is met when an operation will complete in less than one clock cycle.

19. The computer system of claim 15 further comprising:
    when the source component is a random logic module, determining whether to add a source buffer based on the length and width of the source component.

20. The computer system of claim 15 further comprising:
    when the sink component is a random logic module, determining whether to add a sink buffer based on the length and width of the source component.

21. The computer system of claim 15 wherein the calculating element optimizes the number of repeater buffers based on the resistance, length, and capacitance of the wire.

* * * * *

UNITED STATES PATENT AND TRADEMARK OFFICE
CERTIFICATE OF CORRECTION

PATENT NO. : 6,684,373 B1
DATED : January 27, 2004
INVENTOR(S) : Bodine et al.

It is certified that error appears in the above-identified patent and that said Letters Patent is hereby corrected as shown below:

Title page,
Item [56], References Cited, U.S. PATENT DOCUMENTS, delete "1/1990 and insert -- 6/1990 --, therefor.

Column 13,
Line 33, after "rise" insert -- , --.

Column 14,
Line 2, after "rise" insert -- , --.
Line 41, after "rise" insert -- , --.

Signed and Sealed this

Twenty-second Day of June, 2004

JON W. DUDAS
*Acting Director of the United States Patent and Trademark Office*